United States Patent
Zoppas et al.

(10) Patent No.: US 9,744,691 B2
(45) Date of Patent: Aug. 29, 2017

(54) INJECTION MOLD WITH SURFACE COATING OF THE INNER SURFACE

(71) Applicant: S.I.P.A. Societa' Industrializzazione Progettazione E Automazione S.P.A., Vittorio Veneto (IT)

(72) Inventors: Matteo Zoppas, Conegliano (IT); Laurent Sigler, Boust (FR); Dino Enrico Zanette, Godega di Sant'Urbano (IT)

(73) Assignee: S.I.P.A. Societa Industrializzazione Progettazione E Automazione S.P.A., Vittorio Veneto (IT)

( * ) Notice: Subject to any disclaimer, the term of this patent is extended or adjusted under 35 U.S.C. 154(b) by 85 days.

(21) Appl. No.: 14/899,398

(22) PCT Filed: Jun. 26, 2014

(86) PCT No.: PCT/IB2014/062614
§ 371 (c)(1),
(2) Date: Dec. 17, 2015

(87) PCT Pub. No.: WO2014/207685
PCT Pub. Date: Dec. 31, 2014

(65) Prior Publication Data
US 2016/0136845 A1    May 19, 2016

(30) Foreign Application Priority Data
Jun. 26, 2013 (IT) .............................. RM2013A0369

(51) Int. Cl.
| | |
|---|---|
| *B29C 45/37* | (2006.01) |
| *B29B 11/08* | (2006.01) |
| *B29C 33/56* | (2006.01) |
| *C23C 16/40* | (2006.01) |
| *C23C 16/455* | (2006.01) |
| *B29B 11/14* | (2006.01) |
| *B29C 33/38* | (2006.01) |
| *C23C 16/02* | (2006.01) |
| *B29L 31/00* | (2006.01) |
| *B29K 467/00* | (2006.01) |
| *B23P 15/24* | (2006.01) |
| *B29K 105/00* | (2006.01) |
| *B29K 267/00* | (2006.01) |

(52) U.S. Cl.
CPC ............. *B29B 11/08* (2013.01); *B29B 11/14* (2013.01); *B29C 33/3842* (2013.01); *B29C 33/56* (2013.01); *B29C 45/37* (2013.01); *C23C 16/0227* (2013.01); *C23C 16/40* (2013.01); *C23C 16/403* (2013.01); *C23C 16/405* (2013.01); *C23C 16/45525* (2013.01); *C23C 16/45555* (2013.01); *B23P 15/24* (2013.01); *B29K 2105/253* (2013.01); *B29K 2267/003* (2013.01); *B29K 2467/003* (2013.01); *B29L 2031/7158* (2013.01); *B29L 2031/757* (2013.01)

(58) Field of Classification Search
None
See application file for complete search history.

(56) References Cited

U.S. PATENT DOCUMENTS

| 2004/0089053 A1 | 5/2004 | Kaminski et al. |
| 2004/0156945 A1 | 8/2004 | Yoon et al. |

FOREIGN PATENT DOCUMENTS

| EP | 1992433 | 11/2008 |

OTHER PUBLICATIONS

Jean-Yves Charmeau, Mikael Chailly, Vincent Gilbert and Yves Bereaux; "Influence of Mold Surface Coatings in Injection Molding, Application to the Ejection Stage"; International Journal of Material Forming; Apr. 1, 2008; pp. 699-702; vol. 1, No. S1.
M. Cremer, E. Broszeit, G. Berg and M. Heinze; "Coatings in Polymer Processing. CrxN Coatings Produced by PVD-Magnetron Sputtering (MSPVD) Open New Possibilities in the Field of Wear Protection for Polymer Plastification Units"; Materialwissenschaft Und Werkstofftechnik, Wiley—VCH Verlag Gmbh & Co.; Jan. 1, 1998; pp. 555-561; vol. 29, No. 9.
Dwayne Douglas; "Lower Deposition Temperature PVD Coatings Allow for Greater Choice in Mold Materials"; MoldMaking Technology; Jun. 3, 2004; 3 pgs.
Eric Deguns; "Atomic Layer Deposition an Introduction to Theory and Applications"; Cambridge Nanotech Simply ALD; Oct. 4, 2011; pp. 1-48.
Zoheir N. Farhat; "Wear Resistant Composite Coatings"; Materials Characterization; Apr. 1, 2009; pp. 337-345; vol. 60, No. 4.
M.A. Gomez, J. Romero, A. Lousa and J. Esteve; "Tribological Performance of Chromium/Chromium Carbide Multilayers Deposited by R.F. Magnetron Sputtering"; Surface & Coatings Technology; Nov. 1, 2005; pp. 1819-1824; vol. 200, No. 5-6.
H. Tiznado, D. Dominguez, W. De La Cruz, R. Machorro, M. Curiel and G. Soto; "TiO2 and A1203 Ultra Thin Nanolaminates Growth by ALD; Instrument Automation and Films Characterization"; Revista Mexicana de Fisica; Dec. 2012; pp. 459-465; vol. 58.

(Continued)

*Primary Examiner* — Jill Heitbrink
(74) *Attorney, Agent, or Firm* — Stetina Brunda Garred & Brucker

(57) ABSTRACT

A blow mold for PET bottles has the inner surface which contacts the hot PET during the blowing operation, coated with a layer of ceramic material having a nanometric thickness, of which at least one thickness layer is $Al_2O_3$ and/or $TiO_2$ deposited by ALD technique. Due to this technique, the PET preforms are subject to less friction during the contact with the interior of the mold.

4 Claims, No Drawings

(56) References Cited

OTHER PUBLICATIONS

W. Kaiser, Ch. Bader and R. Wild; "TiN-Beschichtung verbessert Spritzgielben von Thermoplasten"; Plastverarbeiter, Heuthig GmbH; Oct. 1, 1989; pp. 84-90; vol. 40, No. 10.

Von Prof Dr-Ing. Georg Menges; "Messung von Haftreibungskoeffizienten Zur Ermittlung Von Oeffnungs-Und Entformungsdraeften Bie Spritzgiesswerkzeugen"; Kunstoffe, Carl Hanser Verlag, Munchen, De; Sep. 1, 1981, pp. 552-557; vol. 71, No. 9.

Monica De Mesquita Lacerda, Julio Miranda Pureza, Jose Fernando Fragalli, Ney Mattoso Filho and Yip-Wah Chung; "Thermal Evaluation of TiN/CNx Multilayer Films"; Materials Chemistry and Physics; Sep. 18, 2011; pp. 278-283; vol. 131, No. 1.

Oerlikon Balzers Corporate Brochure; "Your Reliable partner in Maximising Performance of Tools and Precision Components"; Aug. 2007; pp. 1-8.

A.S. Pouzada, E.G. Ferreira and A.J. Ponies; "Friction Properties of Moulding Thermoplastics"; Polymer Testing, Elsevier; Dec. 1, 2006; pp. 1017-1023; vol. 25, No. 8.

S. Rossi, Y. Massiani, E. Bertassi, F. Torregrosa and L. Fedrizzi; Low Temperature Plasma Immersion Ion Implantation of Nitrogen on a Mould Steel; Thin Sold Films, Elsevier-Sequoia S.A.; Sep. 2, 2002; pp. 160-168; vol. 416, No. 1-2.

E.K. Tentardini, C. Kwietniewski, F. Perini, E. Blando, R. Hubler and I.J.R. Baumvol; "Deposition and Characterization of Non-Isostructural Multilayers"; Surface & Coatings Technology, Elsevier, Jan. 25, 2009; pp. 1176-1181; vol. 203, No. 9.

INJECTION MOLD WITH SURFACE COATING OF THE INNER SURFACE

CROSS REFERENCE TO RELATED APPLICATIONS

The present application claims priority to PCT International Application No. PCT/IB2014/062614 filed on Jun. 26, 2014, which application claims priority to Italian Patent Application No RM2013A000369 filed Jun. 26, 2013, the entirety of the disclosures of which are expressly incorporated herein by reference.

STATEMENT RE: FEDERALLY SPONSORED RESEARCH/DEVELOPMENT

Not Applicable.

FIELD OF THE INVENTION

The present invention relates to the field of production of containers made of a thermoplastic material. In particular, it relates to a mold which reduces the physical and chemical reactions between the molten PET material and steel surfaces of the molding parts of the mold during the injection step in a process for molding preforms, thus reducing frictions.

BACKGROUND ART

In the process of injection molding the transformation of a polymeric material, typically thermoplastic such as PET in the form of granules, into a manufactured product with defined shape occurs. The process begins with the high pressure injection of the molten material into a molding cavity generally having walls made of steel, and ends with the extraction of the preform from the mold after solidification by cooling. The cooling modes and time are critical factors in the molding process. By cooling time it is meant the time in which the component is inside the mold, but there is no more flow of molten material. Actually, the physical phenomenon of the cooling of the molten material begins as soon as this is injected into the cavity and comes into contact with the cold walls of the mold that, as said, are generally made of steel. This phenomenon of rapid cooling can lead to the cooling of the molten mass, or of a part thereof, before it can reach the mold surface. For the complete filling of the mold to occur, the injection speed and pressure must be high enough to counteract the phenomenon of rapid cooling of the molten mass. For molding PET preforms with thin walls, higher performance of the machine is required as in this case the problem of rapid cooling is more accentuated, moreover the consequences of the friction of the molten mass with the steel walls of the mold can be more significant. The consequence is the potential risk of getting deformed or incomplete preforms (short shot). It is known that in the PET container industry, injection molding of preforms which have a total length L greater than or equal to 100 mm and an L/t ratio greater than 50, where "t" is the thickness of the wall, is particularly delicate for the above reasons. Molding preforms with L/t ratio greater than 50 using traditional equipment, molds and materials results in technical difficulties hard to overcome. In fact, in order to counteract the phenomena of freezing of the material during injection, high injection speed and high pressures would be required. The latter, in particular, would generate strong forces on the elements forming the mold and which should be contrasted to prevent the undesired opening thereof, by necessary additional strong closing force of the press platens.

All this general increase of the forces involved would lead to a high wear, if not even to the failure, of the elements forming the mold and of the elements forming the injection press.

Apart from the above-described technical problems, in any case there would not be the certainty of obtaining a correct molding of the preforms. In fact, high molding pressures and high speed of molten material would result, the first ones, in an occurrence of burrs (flash) on the preforms and, the second ones, in the difficulty of expulsion of air and gas from the molding cavity during the operation of filling by the molten material. This second phenomenon would, once again, lead to an incomplete formation of some parts of the preform and in particular the neck end surface, the crest of the threads and of the grip ring.

Moreover, the parameters related to the molding of preforms with thin walls have necessarily very narrow process windows (requiring very small suitable temperature and pressure ranges) and therefore the risk of incomplete forms (short shot) increases and so the number of rejects. The same problems can already be encountered for preforms having a length lower than 100 mm having an L/t ratio greater than 45. In order to improve and facilitate the filling and the ability to inject preforms with an L/t ratio of between 60 and 65, an expedient might be to increase the temperature of the molten PET during the injection step so that PET remains more fluid, considering that the viscosity of the polymer is highly dependent on its temperature during the process. This expedient can help, but its main drawback is the negative impact that the increase in temperature has on the duration of the molding cycle, since the higher the temperature of the molten PET, the longer the duration of the cycle, due to the longer cooling time, and therefore the lower the productivity of the system. Another drawback consists, under these conditions, in the drastic but undesired increase in the level of acetaldehyde and this is an additional problem for the production of containers for beverages, especially those beverages, such as water, for which the quality of taste is a critical factor. Another well known expedient in the industry is to modify the finish of the steel surface to reduce the mechanical interaction between steel and PET. This can be achieved by applying a surface finish such as that reproducing the surface of lotus leaves which is known for its anti-adhesive and self-cleaning properties. To date, however, no solutions are known which can improve the production of preforms with thin walls, and both for preforms with L lower than 100 mm and thin walls having the L/t ratio>45, and for preforms with L≥100 mm and thin walls having L/t>50, there is a technological limit, as previously disclosed. A further drawback of the traditional molds consists in the difficulty of opening and removing the preform from the mold (demolding). The need of finding a solution to the problem is therefore felt.

SUMMARY OF THE INVENTION

It is the main object of the present invention to find a method to improve the production of thin-walled preforms, i.e. preforms with an L/t ratio greater than 50, with L typically but not necessarily greater than or equal to 100 mm or preforms with a length lower than 100 mm having an L/t ratio greater than 45. The object is achieved by reducing the friction between the molten PET material and the molding steel surface of the mold through a reduction of their chemical-physical interaction. A system is therefore proposed which reduces the chemical-physical interactions and not directly the mechanical ones, and which consists in the application of a thin coating of the molding steel surface which can significantly reduce these chemical-physical interactions. The object is thus achieved by a mold having steel walls, according to claim 1, for the production of preforms from thermoplastic material by injection molding, comprising a coating having at least one ceramic layer, or nanolayer, of material, or nanomaterial, having a thickness between 10 and 1000 nm which coats the walls, or molding surfaces, of the mold whereby the friction coefficient between the thermoplastic material and the mold walls is equal to or less than 0.14.

Advantageously, the ceramic material is $Al_2O_3 TiO_2$ or TiN or TiAlN or CrN and CrC or AlN, etc. Advantageously, the at least one layer may be a complex nanolayer such as a sandwich or multilayer structure where the single nanolayers can also each be made of a different material. For example, in the case of a complex nanolayer with two nanolayers, the materials may be $Al_2O_3$ and $TiO_2$, preferably with a total coating thickness between 90 and 120 nut, so that the friction coefficient between the thermoplastic material and the mold walls is of about 0.13. An example of a sandwich coating comprises a first layer of a first ceramic material, a second layer of ceramic material, different from that of the first layer, and a third layer of ceramic material, equal to that of the first layer. More particularly, a sandwich coating can, for example, consist of three superposed layers of $Al_2O_3$—$TiO_2$—$Al_2O_3$, respectively.

Preferably, a mold is provided for the production of PET preforms. PET, or polyethylene terephthalate, is one of the most used materials in the world for the production of containers for food packaging, in particular bottles of various sizes, due to its excellent chemical and physical properties, in particular in terms of surface quality, which is of great importance to the end user.

Advantageously, by virtue of the molds of the invention, it is possible to produce PET preforms reducing the processing time and cycles, obtaining high quality products. Advantageously, by virtue of the molds of the invention, the operation of demolding of the preform is greatly improved compared to traditional molds.

It is another object of the invention to provide a process, according to claim 8, for obtaining said steel molds, with a reduced chemical interaction with the thermoplastic material, such a method comprising:

a step of cleaning the surface of the mold walls,
a step of polishing the mold walls,
a step of coating the mold walls by depositing at least one layer of thickness in the range between 10 and 1000 nm of ceramic material.

Advantageously, the cleaning and/or polishing steps are provided for minimizing the friction coefficient between the steel and the molten thermoplastic material, for example to a value of about 0.20.

Preferably, molds for the production of PET preforms are, obtained with this process. Advantageously, the deposition process uses the technology known as Atomic Layer Deposition (ALD). Advantageously, the deposition process is a process that uses ALD together with other techniques such as Chemical Vapor Deposition (CVD), Pressure Vapor Deposition (PVD) or others.

DESCRIPTION OF A PREFERRED EMBODIMENT OF THE INVENTION

The application of a special coating using the ALD technology, but also other technologies such as PVD or CVD alone or in combination, is carried out with the aim of reducing the chemical-physical interaction between the mass of molten PET and the steel molding surfaces, or walls, of a mold for injection molding. A reduction of the chemical-physical interactions and therefore of the molecular adhesion, between the mass of PET and the steel, means a reduction in the friction between PET and steel and therefore greater ease of injection with reduced danger of "short shots". Among the most chemically inert materials used for coating molding surfaces are thin ceramic based, nanocomposite coatings, such as $Al_2O_3$, TiN, $TiO_2$ or TiAlN or CrN or CrN and AlN, etc. These nanostructured coatings, in addition to reducing the chemical-physical interactions reducing the friction coefficient between the molten material and the molding surfaces, have been shown to be superior to standard coatings for certain qualities, such as degree of homogeneity, hardness, resistance to fracture, wear, corrosion, producing also a better finish of the treated surfaces. The cleaning of the overlapping molding surfaces prior to deposition is a critical element of the process. The polishing of the surfaces is carried out in order to obtain already a lower friction coefficient, also in anticipation of the subsequent process of detachment of the preform from the die and also for the preparation of the surface to the deposition process. Once the polishing has been carried out, it is possible to carry out the deposition process of the nanolayer or nanolayers of ceramic nanomaterial. The adhesion of the deposition, and its durability are also critical elements since it is provided that the deposition should remain adherent to the steel surface for several million cycles of production of preforms. A proper balance must therefore be found between the thickness of the layer or layers, which concerns the duration of the deposition even in case of wear and tear over time, and the mechanical strength which is greater for a thin layer. These elements also depend on the material used for the deposition and the use of double layers of different material can offer greater flexibility in the choices, it being possible to vary the relative thickness of the single layers, as well as their composition.

Examples

Further advantages of the invention are apparent from the following table in which there are examples of molds, provided by way of non limiting example.

| MATERIAL OF THE MOLDING SURFACE | TOTAL AVERAGE DEPOSITION THICKNESS | FRICTION COEFFICIENT | FRICTION REDUCTION PERCENTAGE |
|---|---|---|---|
| polished steel | — | 0.20 | — |
| Single nanolayer of $Al_2O_3$ | 100 nm (nominal) 92 nm (actual) | 0.14 | 30% |
| Complex nanolayer - two layers: one of $Al_2O_3$ and one of $TiO_2$ | 100 nm (nominal) 110 nm (actual) | 0.13 | 35% |

The invention claimed is:
1. A mold having steel walls for the production of preforms made of polyethylene terephthalate, PET, by injection molding, comprising a coating of ceramic material with a thickness between 90 and 120 nm which coats the walls of the mold, wherein the coating is made of either a layer of $Al_2O_3$ or a multilayer structure having a first layer made of

$Al_2O_3$ and a second layer made of $TiO_2$, the mold producing the preforms with L/t>50, when L>100 mm or preforms with L/t>45 when L<100 mm, where "L" and "t" are the total length of the preform and the wall thickness of the preform, respectively.

2. A process for obtaining molds according to claim 1, having a reduced chemical interaction with, the PET, such a process comprising:
   a step of cleaning the surface of the mold walls,
   a step of polishing the mold walls,
   a step of depositing on the mold walls a ceramic coating of thickness in the range between 90 and 120 nm made of either a layer of $Al_2O_3$ or a multilayer structure having a first layer made of $Al_2O_3$ and a second layer made of $TiO_2$.

3. A process according to claim 2, wherein the Atomic Layer Deposition, ALD, technique is provided for depositing the ceramic coating.

4. Use of a mold according to of claim 1 for the production of preforms made of PET, with L/t>50, when L>100 mm or preforms with L/t>45 when L<−100 mm, were "L" and "t" are the total length of the preform and the wall thickness of the preform, respectively.

\* \* \* \* \*